United States Patent [19]
Grupen-Shemansky et al.

[11] Patent Number: 6,022,761
[45] Date of Patent: Feb. 8, 2000

[54] METHOD FOR COUPLING SUBSTRATES AND STRUCTURE

[75] Inventors: Melissa E. Grupen-Shemansky, Phoenix; Jong-Kai Lin; Theodore G. Tessier, both of Chandler, all of Ariz.

[73] Assignee: Motorola, Inc., Schaumburg, Ill.

[21] Appl. No.: 08/654,466

[22] Filed: May 28, 1996

[51] Int. Cl.[7] .......................... H01L 21/44; H01L 21/48; H01L 21/50

[52] U.S. Cl. .......................... 438/125; 438/106; 438/118; 438/127

[58] Field of Search ................................ 438/125, 118, 438/106

[56] References Cited

U.S. PATENT DOCUMENTS

| | | |
|---|---|---|
| 4,067,104 | 1/1978 | Tracy . |
| 4,427,715 | 1/1984 | Harris . |
| 4,774,633 | 9/1988 | Dehaine et al. . |
| 5,014,111 | 5/1991 | Tsuda et al. . |
| 5,074,947 | 12/1991 | Estes et al. . |
| 5,311,396 | 5/1994 | Steffen . |
| 5,504,035 | 4/1996 | Rostoker et al. . |
| 5,849,609 | 12/1998 | Chun ........................................ 438/125 |
| 5,875,545 | 3/1999 | DiStefano et al. ...................... 438/125 |

FOREIGN PATENT DOCUMENTS

| | | |
|---|---|---|
| 0475022 | 3/1992 | European Pat. Off. . |
| 4325458 | 2/1995 | Germany . |
| 215057 | 12/1983 | Japan . |
| 595637 | 1/1984 | Japan . |
| 150931 | 6/1988 | Japan . |
| 9424704 | 10/1994 | WIPO . |

OTHER PUBLICATIONS

"Area Bonding Conductive Epoxy Adhesives for Low Cost Grid Array Chip Carriers", Justin C. Bolger and John M. Czarnowski, International Electronics Mfg. Symposium, Austin, TX, Oct. 2–4, 1995.

Patent Abstracts of Japan, vol. 009, No. 110 (E–314), May 15, 1985 & JP 60001849 A (Sharp KK), Jan. 8, 1985.

*Primary Examiner*—Kevin M. Picardat
*Assistant Examiner*—D. Mark Collins
*Attorney, Agent, or Firm*—Kevin B. Jackson; A. Kate Huffman

[57] ABSTRACT

A method for connecting substrates includes using an adhesive interposer structure (11) to bond a semiconductor device (26) to a substrate (18). The adhesive interposer structure (11) includes a non-conductive adhesive laminant (12) and conductive adhesive bumps (13). The conductive adhesive bumps (13) provide a conductive path between conductive bumps (27) on the semiconductor device (26) and conductive metal pads (21) located on the substrate (18). In an alternative embodiment, a conductive adhesive material (34) is screen or stencil printed into vias (39) located on a printed circuit board (38) to form conductive adhesive bumps (33). A non-conductive adhesive (52) is then screen or stencil printed onto the printed circuit board (38) adjacent the conductive adhesive bumps (33). A semiconductor die is then connected to the structure.

19 Claims, 4 Drawing Sheets

METHOD FOR COUPLING SUBSTRATES AND STRUCTURE

BACKGROUND OF THE INVENTION

This invention relates, in general, to semiconductor device assembly, and more particularly to methods and structures for connecting substrates.

Flip-chip technology is rapidly becoming an assembly technique of choice in applications such as smartcards. Flip-chip technology is used to connect a semiconductor chip to a thin printed circuit board to form a substrate assembly. This substrate assembly is then incorporated, for example, into a credit card device to provide a smartcard. Once incorporated into the credit card device, the semiconductor chip provides account tracking and security features for the cardholder.

In a typical smartcard flip-chip assembly process, a bumped semiconductor chip is bonded to a printed wiring or circuit board. The printed circuit board typically consists of a resin material with layers of patterned metal on both sides. The layers of patterned metal form contact pads and conductive traces. Metallized vias typically are used connect the metal layers.

A conductive adhesive is used to connect the bumps on the semiconductor chip to corresponding metal contact pads on the printed circuit board. The assembly is then heated to cure the conductive adhesive. Next, a non-conductive encapsulant or laminant is placed in gaps between the semiconductor die and the printed circuit board and between adjacent bumps. This is commonly referred to as an "underfill" process. The assembly is then heated again to cure the non-conductive encapsulant.

This process has several disadvantages. First, printed circuit boards having metal layers on both sides are expensive. Also, the process used to place the conductive adhesive in contact with the semiconductor bumps can have variations that result in inconsistent amounts of adhesive being applied. This can result in an inoperable device due to opens and/or shorts. In addition, the conductive adhesive curing process stresses the semiconductor die. This is due to, among other things, differences in the thermal expansion coefficients between the semiconductor die and the printed circuit board. Such stress can damage the semiconductor die. Additionally, the underfill process can be inconsistent thereby leaving voids, particularly at the conductive adhesive/non-conductive adhesive interface. Such voids can lead to reliability problems. Furthermore, the conventional smartcard flip-chip process is expensive because of its multiple steps.

As is readily apparent, methods and structures are needed for connecting substrates that are reliable, cost-effective, and efficient.

DETAILED DESCRIPTION OF THE DRAWINGS

In general, the present invention relates to methods and structures for connecting substrates to form a substrate module. More particularly, the present invention utilizes an adhesive interposer structure to connect an semiconductor chip to a thin printed circuit board. The interposer structure comprises an adhesive preform structure. Alternatively, the adhesive interposer structure is formed directly on the thin printed circuit board using, for example, masking techniques. The interposer structure greatly simplifies assembly processing particularly in smartcard applications. The present invention will be better understood by referring to FIGS. 1–9 together with the following detailed description.

Figure 1:
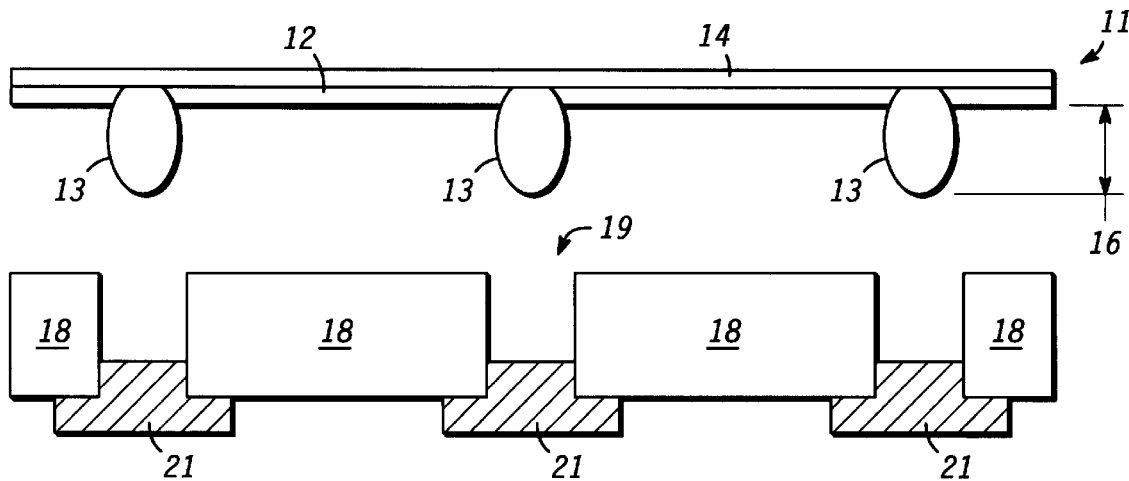
FIGS. 1–4 illustrate enlarged cross-sectional views of a substrate structure at various stages of manufacture according to the present invention.

FIG. 1 illustrates an enlarged cross-sectional view of an adhesive interposer structure or adhesive bump preform structure 11 and a printed circuit board, substrate, or base substrate 18 at an early stage of processing according to the present invention. Adhesive interposer structure 11 includes a non-conductive adhesive or encapsulant portion 12 and a plurality of conductive adhesive bumps, portions, or dots 13, which are coupled to non-conductive adhesive portion 12. Adhesive interposer structure 11 is also referred to as an adhesive bump preform or an "Area Bonding Conductive (ABC)" film adhesive.

Non-conductive adhesive portion 12 comprises, for example, a dielectric epoxy adhesive. In a preferred embodiment, non-conductive adhesive portion 12 comprises a partially cured (i.e., a B-stage) oxide or silica-filled dielectric epoxy resin (e.g., novolac-type). Conductive adhesive bumps 13 preferably comprise the same resin as non-conductive adhesive portion 12 with the addition of a conductive filler such as silver, which results in an electrically conductive epoxy resin. Typically, the conductive filler is on the order of 65–85% by weight of the total components making up the conductive adhesive. Adhesive bump preform materials are available from Merix Corporation of Needham Heights, Mass.

The placement or location of conductive adhesive bumps 13 within adhesive interposer structure 11 is a function of the application. That is, the placement depends on the electronic device design and printed circuit board design requirements of the manufacturer. Optionally, adhesive interposer structure 11 further includes a carrier film backing or support film 14 for added support. Backing 14 comprises for example, a polyethylene terephthalate resin film (commonly known as MYLAR®) or the like.

Typically, conductive adhesive bumps 13 extend (i.e., have an exposed height) above non-conductive adhesive portion 12 by a distance 16 in range between about 50 microns to about 200 microns. Distance 16 is adjusted according to the depth of vias 19 (described below) such that conductive adhesive bumps 13 contact conductive metal pads 21 (described below). Conductive adhesive bumps 13 typically have a diameter on the order of 200 to 650 microns, which is also a function of the application.

Substrate 18 includes a plurality of vias 19, which extend from one side of substrate 18 to the opposite side. Each of vias 19 terminates with a conductive metal pad 21 on one side of substrate 18. Conductive metal pads 21 typically comprise copper/nickel/gold. Preferably, a portion of conductive metal pad 21 extends partially into the via. The combination of vias 19 and conductive metal pads 21 is an important feature of the present invention. First, having conductive metal pads 21 on only one side of substrate 18 reduces cost compared to prior art substrates having metal layers on both major surfaces and completely metallized vias. Also, this allows a manufacturer to place conductive adhesive bumps 13 within vias 19 to minimize the overall thickness of the finished substrate module. This is important particularly in smartcard applications where overall thickness is a critical parameter.

Substrate 18 comprises for example, a flexible polymeric circuit board. Suitable materials include FR4, epoxy glass, polyester, polyimide, or the like. The thickness of substrate 18 depends on the application. In a smartcard application, substrate 18 preferably has a thickness on the order of 50 to 250 microns The depth of vias 19 depends on the exposed height of conductive adhesive bumps 13 and is fixed such that each of conductive adhesive bumps 13 contacts a conductive metal pad 21. Each of vias 19 has a diameter that is greater than the diameter of conductive adhesive bumps 13 and depends on the flow properties of the conductive adhesive material. For example, with the conductive adhesive material described above, the diameter of vias 19 is on the order of 20 microns greater than the diameter of conductive adhesive bumps 13. As indicated above, the placement of conductive adhesive bumps 13 is designed to correspond to the location of vias 19. Substrates like substrate 18 are available from Micro-Connectique Technologies (MCTS) of Mante-la-Jolie, France.

Figure 2:
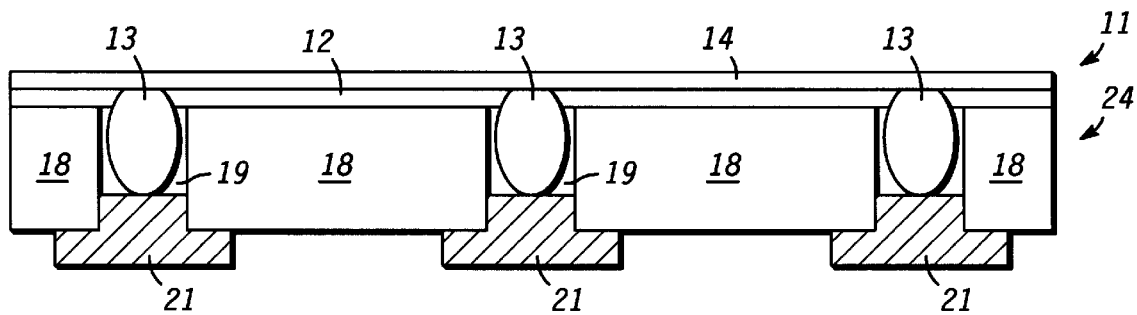

FIG. 2 illustrates an enlarged cross-sectional view of the substrate structure of FIG. 1 at a later step in processing. Adhesive interposer structure 11 is coupled to substrate 18 such that conductive adhesive bumps 13 mate, are within, or are coupled to a corresponding one of vias 19 to provide an intermediate assembly structure 24. As shown in FIG. 2, each of conductive adhesive bumps 13 couple to a conductive metal pad 21 to provide a conductive path.

Preferably, when adhesive interposer structure 11 comprises a novolac-type resin, it is first tacked to substrate 18 by applying a pressure on the order of 2–4 psi and heating the structure for approximately 1 to 2 seconds at about 80° C. to 100° C. to dry out solvent present in the resin. Also, the heat may cause partial curing (or B-staging) of the resin. At this point, intermediate assembly structure 24 can be conveniently loaded into a carrier (e.g., a reel carrier, waffle pack, or the like) for storage. This is a significant advantage over the prior art because the manufacturer of substrate 18 for example, can apply adhesive interposer structure 11 to substrate 18, partially cure the interposer, and package the resulting intermediate assembly for shipment to a semiconductor chip supplier or manufacturer. This greatly simplifies the processing that is required of the semiconductor chip supplier.

For example, the semiconductor chip supplier can better utilize automated assembly equipment (e.g., tape and reel equipment) to connect a semiconductor chip to the intermediate assembly. This way, the chip supplier avoids having to use the prior-art multi-step adhesive application and cure process, which can lead to reliability problems due to stress on the semiconductor chip. The method according to the present invention also eliminates the underfill process thereby reducing void problems at the conductive adhesive bump/non-conductive encapsulant interface. Additionally, by using adhesive interposer structure 11, variations in conductive adhesive bump dimensions are reduced thereby reducing the number of open and/or short failures.

Figure 3:
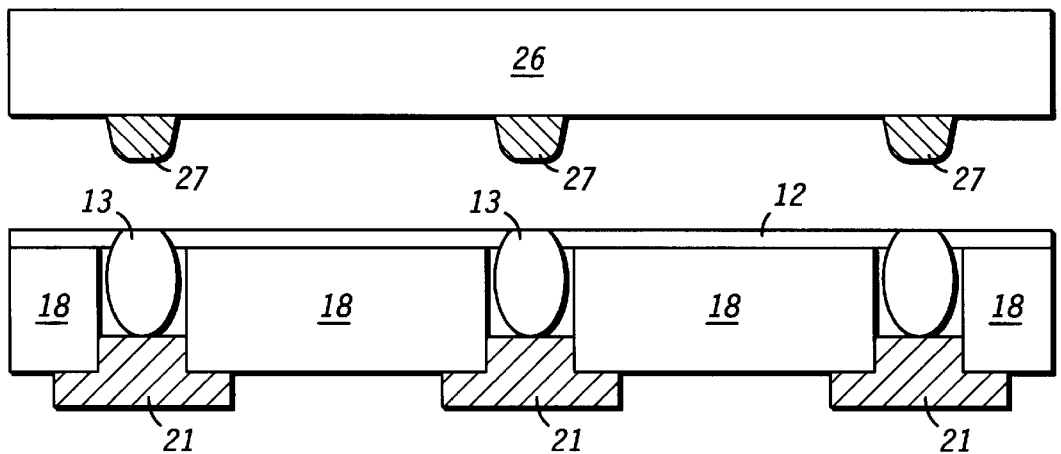

Before coupling a substrate or semiconductor chip, die or device 26 to adhesive interposer structure 11, support film 14 is removed as shown in FIG. 3. Preferably, support film 14 is removed before the substrate assembly is placed in a carrier device as described above. Semiconductor device 26 includes a plurality of conductive bumps, portions, or raised portions 27 for electrically coupling to conductive metal pads 21.

Semiconductor device 26 comprises, for example, an integrated circuit device such as a microcontroller device, a memory device, or the like. Conductive bumps 27 typically comprise a deposited solderable metal such as copper, gold, or nickel-gold and are formed using well known processing techniques (e.g., wire bumping, electroplating, evaporation, etc.). In an alternative embodiment (not shown), conductive portions 27 comprise a metal pad or portion without a bump.

Figure 4:
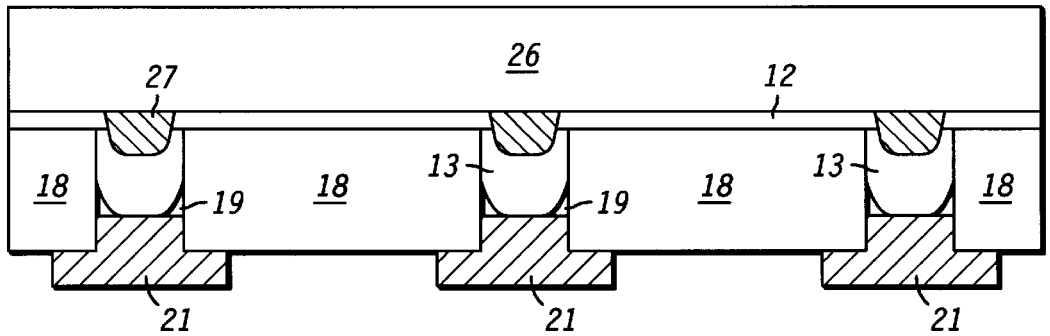

To couple semiconductor device 26 to adhesive interposer structure 11, semiconductor device 26 is aligned and pressed into contact with adhesive interposer structure 11 such that each of conductive bumps or portions 27 is coupled to a corresponding conductive adhesive bump 13 and a corresponding conductive metal pad 21 to provide substrate structure, flip-chip assembly, substrate module, or smartcard module 28 shown in FIG. 4. Substrate module 28 is then cured by exposing it to a pre-determined elevated temperature, which is a function of the adhesive materials used. For example, when adhesive interposer structure 11 comprises a novolac-type resin, substrate module 28 is exposed to approximately 155° C. to about 165° C. for approximately 45 minutes.

Figure 5:
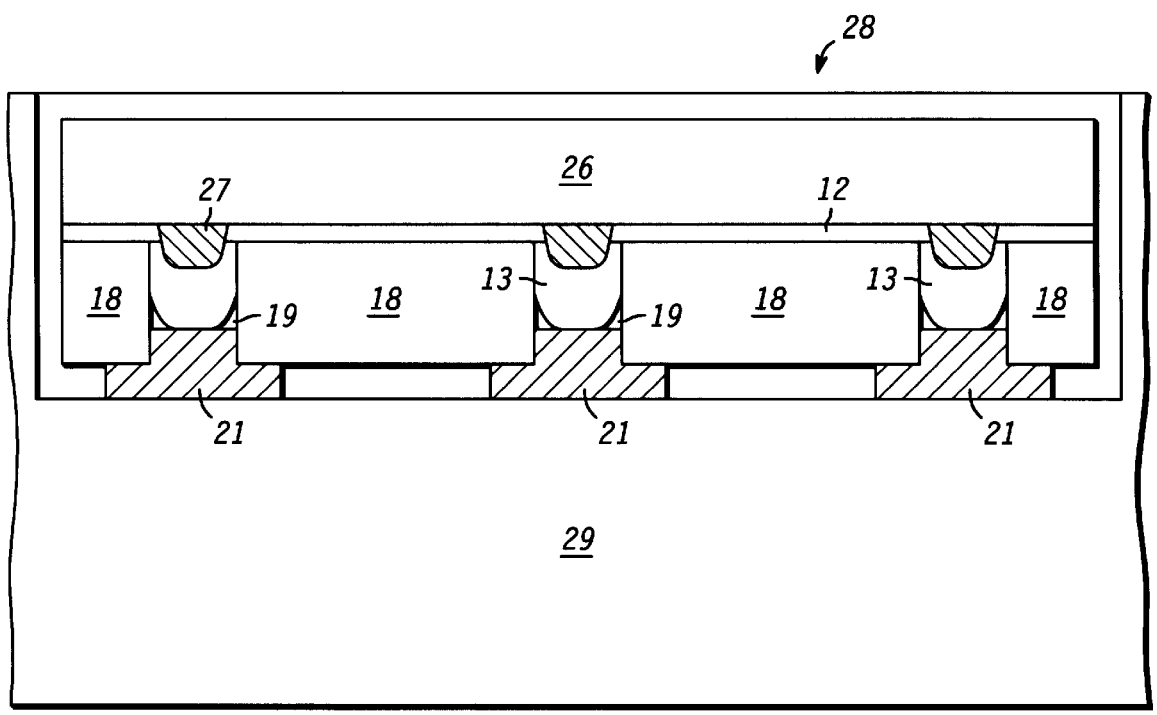
FIG. 5 illustrates an enlarged cross-sectional view of a smartcard device incorporating the structure of FIG. 4.

Once cured, substrate module 28 is stored until it is coupled to the next level of assembly such as a card body, device, or substrate 29 shown in FIG. 5, which illustrates a simplified cross-sectional view of a smartcard device or assembly with an embedded substrate module 28. Substrate module 28 is conveniently stored in a tape and reel carrier or waffle pack carrier to support automation at the next level of assembly.

Figure 6:
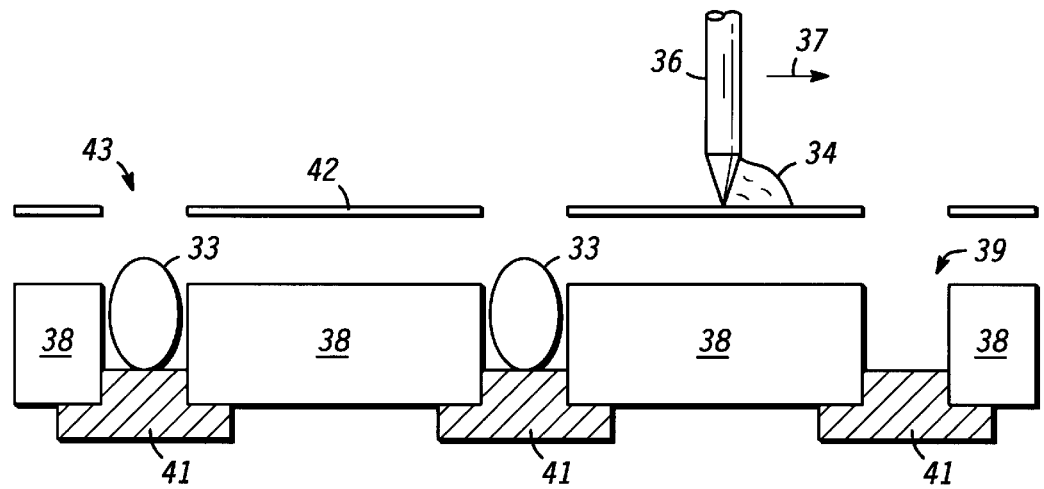
FIGS. 6–9 illustrate enlarged cross-sectional views of a substrate structure at various stages of manufacture according to alternative embodiment of the present invention.
Figure 7:
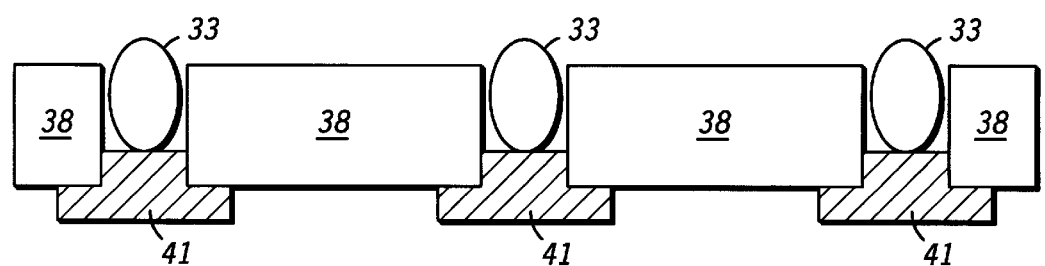

FIGS. 6–9 illustrate enlarged cross-sectional views of an alternative method for forming a substrate structure according to the present invention. FIG. 6 illustrates a substrate 38 having a plurality of vias 39 and a plurality of metal contact pads 41. To selectively deposit or place a conductive adhesive bump 33 in each of vias 39, a screen mask or stencil 42 having openings 43 is used. The placement of openings 43 corresponds to the location of vias 39. A blade device 36 is used to spread a bulk conductive adhesive material 34 across (as represented by arrow 37) screen mask 42 to selectively deposit conductive adhesive material 34 in each of vias 39 to provide the structure shown in FIG. 7. In a preferred embodiment, conductive adhesive material 34 comprises a B-stageable epoxy such as 1873-14, which is available from Merix Corporation.

Figure 8:
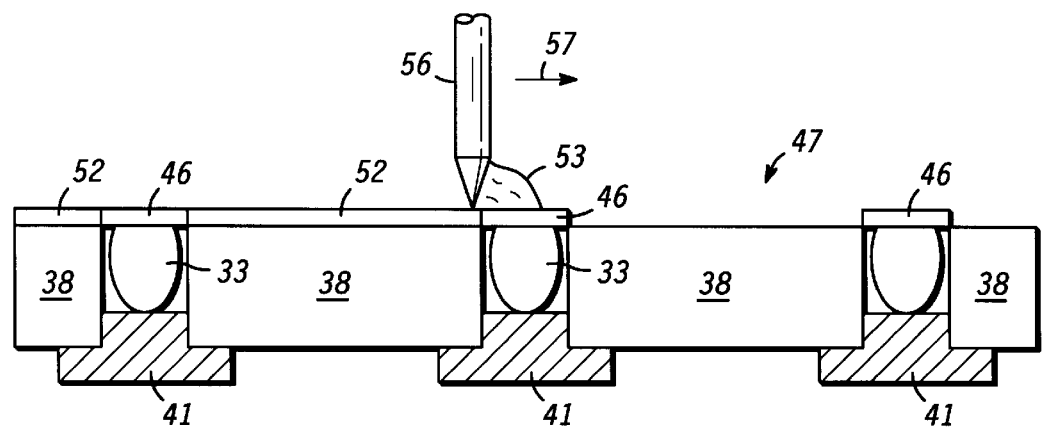
Figure 9:
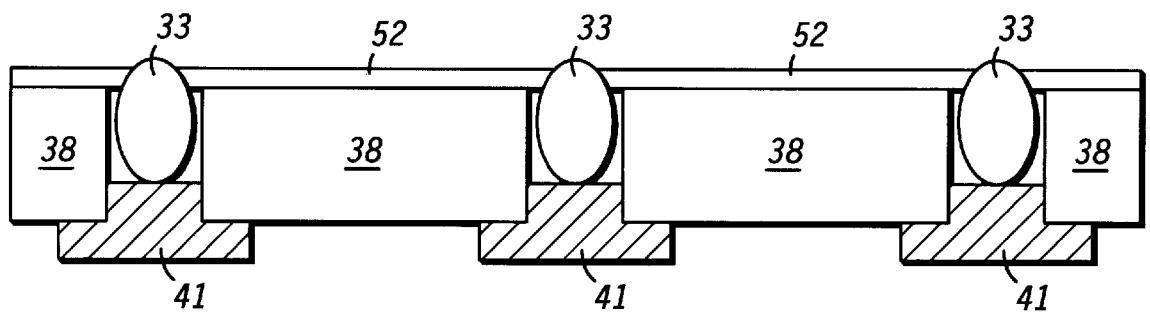

Next, the structure is exposed to an elevated temperature to partially cure conductive adhesive bumps 33. When conductive adhesive bumps 33 comprise 1873-14, the structure is exposed to approximately 80–100° C. for approximately 30 seconds. After the partial cure step, a second screen mask or stencil 46 having openings 47 is used to selectively deposit or place a non-conductive adhesive material or encapsulant 52 (i.e., an underchip encapsulant) adjacent to conductive adhesive bumps 33 as shown in FIG. 8. Second screen mask 46 has a reverse pattern (or density) from screen mask 42. A blade device 56 is used to spread a bulk non-conductive adhesive material 53 across (as represented by arrow 57) second screen mask 46 and onto substrate 38 to provide intermediate assembly 61 shown in FIG. 9.

Non-conductive adhesive material 52 comprises for example, the same material as non-conductive adhesive portion 12 described above. Intermediate assembly 61 is ready for semiconductor chip attach, like intermediate assembly 24 shown in FIGS. 2 and 3. After a semiconductor chip is attached, the resulting structure is exposed to an elevated temperature to cure non-conductive adhesive material 52 and to further cure conductive adhesive bumps 33 to provide a substrate module ready for a next level of assembly. In an alternative embodiment, non-conductive material 52 is deposited first followed by the formation of conductive adhesive bumps 33.

By now it should be appreciated that there has been provided methods and structures for coupling substrates together. For example, by using an adhesive interposer structure between a printed circuit board substrate and a semiconductor die, assembly processing is greatly simplified and reliability is improved. This saves on manufacturing costs and capital investments.

While the invention has been described with reference to particular embodiments, this is solely for purposes of illustration and is not to be construed as limiting the scope of the invention claimed below. For example, the adhesive interposer structure is coupled to the semiconductor device first and then to the printed circuit board. Also, other techniques such as selective dispensing techniques are suitable to provide the structure shown in FIG. 9.

What is claimed is:

1. A method for coupling substrates to form a substrate module comprising the steps of:
    providing an adhesive bump preform structure comprising a non-conductive adhesive material and a plurality of conductive adhesive bumps coupled to the non-conductive adhesive material;
    providing a substrate having a plurality of vias extending from one side of the substrate to an opposite side;
    coupling the adhesive bump preform structure to the substrate such that at least one of the plurality of conductive adhesive bumps is within at least one of the plurality of vias, the coupling step including heating the adhesive bump preform structure to partially cure the adhesive bump preform structure; and
    coupling a semiconductor device having a plurality of conductive portions to the adhesive bump preform structure such that at least one of the plurality of conductive portions is coupled to at least one of the plurality of vias to form the substrate module.

2. The method of claim 1 wherein the step of coupling the adhesive bump preform structure to the substrate includes coupling the adhesive bump preform structure to the substrate such that each of the plurality of conductive adhesive bumps is within a corresponding one of the plurality of vias.

3. The method of claim 1 wherein the step of coupling the semiconductor device comprises the steps of:
    placing the semiconductor device in contact with the adhesive bump preform structure; and
    exposing the substrate module to an elevated temperature to cure the adhesive bump preform structure.

4. The method of claim 1 wherein the step of providing the adhesive bump preform structure includes providing the adhesive bump preform structure with a carrier film backing.

5. The method of claim 4 further comprising the step of removing the carrier film backing before the step of coupling the semiconductor device to the adhesive bump preform structure.

6. The method of claim 1 wherein the step of coupling the adhesive bump preform structure to the substrate includes the steps of:
    placing the adhesive bump preform structure in contact with the substrate;
    applying a pressure to the adhesive bump preform structure; and
    subsequently heating the adhesive bump preform structure to partially cure the adhesive bump preform structure.

7. The method of claim 1 further comprising the step of coupling the substrate module to a card substrate to form a smartcard.

8. A method for connecting substrates to form a substrate module comprising the steps of:
    providing a first substrate assembly comprising a base substrate and an adhesive interposer structure, wherein the base substrate includes a plurality of vias, and wherein the adhesive interposer structure includes a non-conductive encapsulant and a plurality of conductive bumps coupled to the non-conductive encapsulant, and wherein the adhesive interposer structure is coupled to the base substrate such that at least one of the plurality of conductive bumps is coupled to one of the plurality of vias, the coupling step including heating the adhesive bump preform structure to partially cure the adhesive bump preform structure; and
    connecting a second substrate having a plurality of conductive bumps formed on one surface to the first substrate assembly such that at least one of the plurality of conductive bumps is coupled to one of the plurality of vias to form the substrate module, and wherein the adhesive interposer structure is between the second substrate and the base substrate.

9. The method of claim 8 wherein the step of providing the first substrate assembly includes providing the first substrate assembly wherein each of the plurality of conductive bumps is coupled to a corresponding one of the plurality of vias.

10. The method of claim 8 wherein the step of connecting the second substrate includes connecting a semiconductor device.

11. The method of claim 10 wherein the step of connecting the second substrate includes connecting a microcontroller device.

12. The method of claim 8 wherein the step of connecting the second substrate to the first substrate assembly includes the steps of:
    aligning the second substrate to the first substrate assembly;
    placing the second substrate in contact with the adhesive interposer structure such that each of the plurality of conductive bumps is coupled to a corresponding via; and
    subsequently heating the adhesive interposer structure to bond the second substrate to the base substrate to form a flip-chip assembly.

13. The method of claim 8 further comprising the step of coupling the substrate module to a card body to form a smartcard assembly.

14. The method of claim 8 wherein the step of providing the first substrate assembly includes providing the first substrate assembly wherein the plurality of conductive bumps have an exposed height in range from about 50 microns to about 200 microns.

15. The method of claim 8 wherein the step of providing the first substrate assembly includes providing the first substrate assembly wherein the base substrate comprises a flexible polymeric circuit board.

16. The method of claim 8 wherein the step of providing the first substrate assembly includes providing the first substrate assembly wherein the base substrate further includes a conductive metal pad coupled to each of the plurality of vias on a side opposite the adhesive interposer structure.

17. A method for connecting a pair of substrates comprising the steps of:
- providing a first substrate having a plurality of conductive vias extending from one side of the first substrate to an opposite side;
- selectively depositing a conductive adhesive into the plurality of conductive vias to provide a plurality of conductive adhesive portions;
- selectively depositing a non-conductive encapsulant onto the first substrate adjacent the plurality of conductive vias to provide an underchip encapsulation;
- providing a second substrate having a plurality of conductive raised portions formed on one surface; and
- coupling the plurality of conductive raised portions to the plurality of conductive adhesive portions, and heating the pair of substrates to elevated temperature.

18. The method of claim 17 wherein the step of coupling the plurality of conductive raised portions to the plurality of conductive adhesive portions comprises the steps of:
- aligning the plurality of conductive raised portions to the plurality of conductive adhesive portions;
- placing the plurality of conductive raised portions into contact with the plurality of conductive adhesive portions; and
- subsequently heating the pair of substrates to elevated temperature.

19. A process for coupling a pair of substrates comprising the steps of:
- providing a semiconductor device having a plurality of conductive portions;
- providing a substrate having a plurality of vias extending from one side of the substrate to an opposite side; and
- coupling the semiconductor device to the substrate using an adhesive bump preform structure, wherein the adhesive bump preform structure comprises a non-conductive adhesive laminant and a plurality of conductive adhesive bumps, and wherein the plurality of conductive adhesive bumps couple the plurality of conductive portions to the plurality of vias.

* * * * *